(12) United States Patent
Harada et al.

(10) Patent No.: US 6,251,774 B1
(45) Date of Patent: Jun. 26, 2001

(54) METHOD OF MANUFACTURING A SEMICONDUCTOR DEVICE

(75) Inventors: Akihiko Harada; Takayuki Saito, both of Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/300,848

(22) Filed: Apr. 28, 1999

(30) Foreign Application Priority Data

Nov. 10, 1998 (JP) .................................................. 10-318556

(51) Int. Cl.[7] ...................... H01L 21/314; H01L 21/4763
(52) U.S. Cl. ..................... 438/637; 438/622; 438/624; 438/634; 438/638; 438/692; 438/700
(58) Field of Search ...................... 438/622, 637, 438/624, 631, 633, 634, 638, 640, 675, 692, 701, 703, 761, 713, 948; 257/758, 751, 752, 759, 762, 774

(56) References Cited

U.S. PATENT DOCUMENTS

| 5,380,546 | * | 1/1995 | Krishnan et al. | 427/126.1 |
| 5,470,789 | | 11/1995 | Misawa . | |
| 5,693,563 | | 12/1997 | Teong . | |
| 5,741,626 | | 4/1998 | Jain et al. . | |
| 5,793,112 | | 8/1998 | Hasegawa et al. . | |
| 5,893,752 | * | 4/1999 | Zhang et al. | 438/687 |
| 5,989,997 | * | 11/1999 | Lin et al. | 438/622 |
| 6,037,664 | * | 3/2000 | Zhoa et al. | 257/758 |
| 6,042,999 | * | 3/2000 | Lin et al. | 430/316 |
| 6,083,822 | * | 7/2000 | Lee | 438/624 |
| 6,110,648 | * | 8/2000 | Jang | 430/312 |

FOREIGN PATENT DOCUMENTS

| 6-275612 | 9/1994 | (JP) . |
| 7-297186 | 11/1995 | (JP) . |
| 9-283520 | 10/1997 | (JP) . |
| 10-189592 | 7/1998 | (JP) . |

\* cited by examiner

*Primary Examiner*—Matthew Smith
*Assistant Examiner*—Igwe U. Anya
(74) *Attorney, Agent, or Firm*—McDermott, Will & Emery

(57) ABSTRACT

There is described a method of manufacturing a semiconductor device for the purpose of preventing damage to a lower wiring layer, wherein wiring elements of dual damascene structure are formed on the lower wiring layer. Under the method, a first silicon nitride film, a first silicon oxide film, a second silicon nitride film, and a second silicon oxide film are formed, in this sequence, on a lower wiring layer. A via hole is formed at a position above the lower wiring layer so as to pass through the second silicon oxide film and the second silicon nitride film. A photoresist is embedded into the via hole so as to cover the internal wall surface thereof. After formation of a protective film from the photoresist, predetermined portions of the second silicon oxide film and the second silicon nitride film are removed, thus forming a wiring trench.

14 Claims, 11 Drawing Sheets

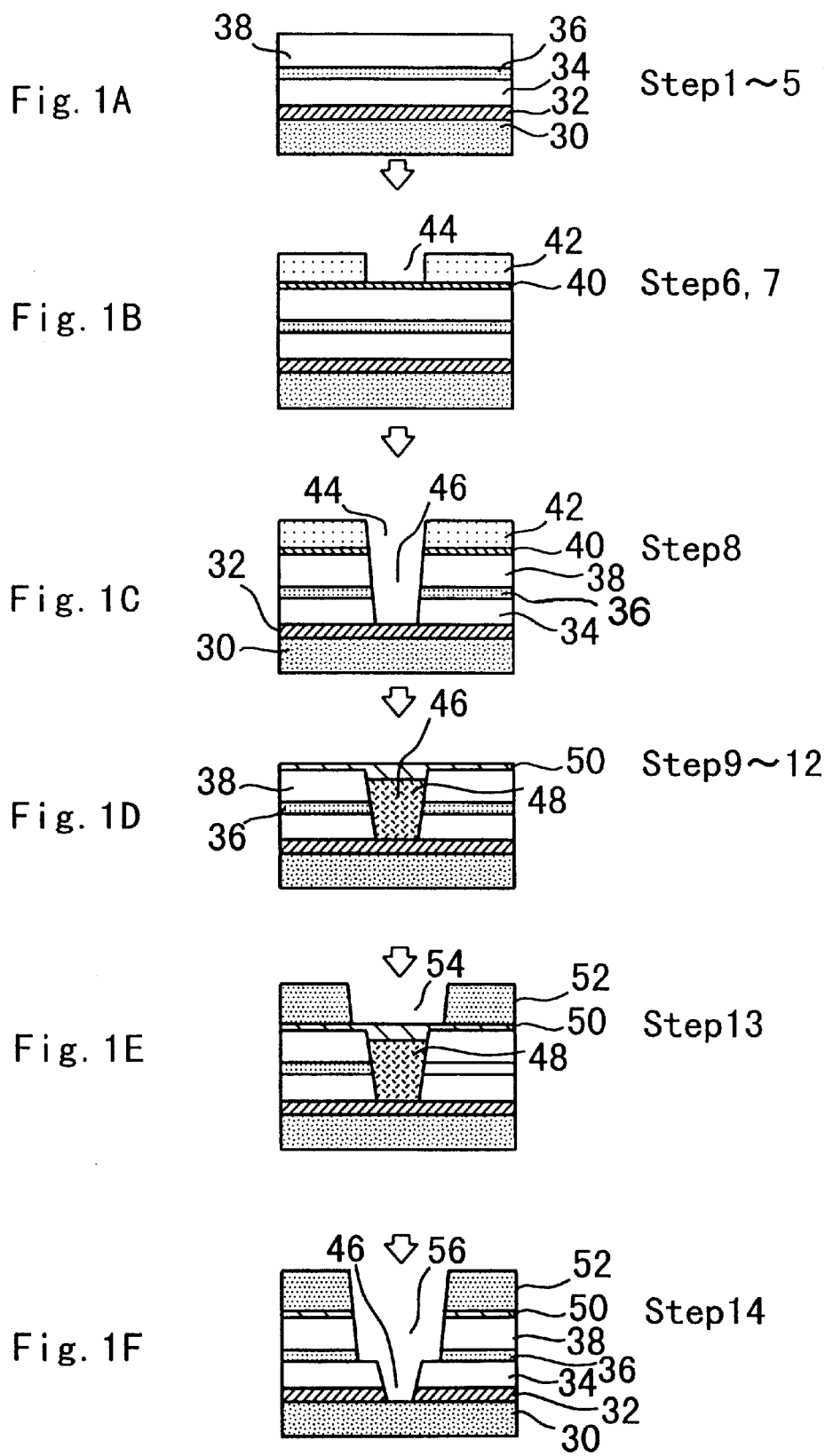

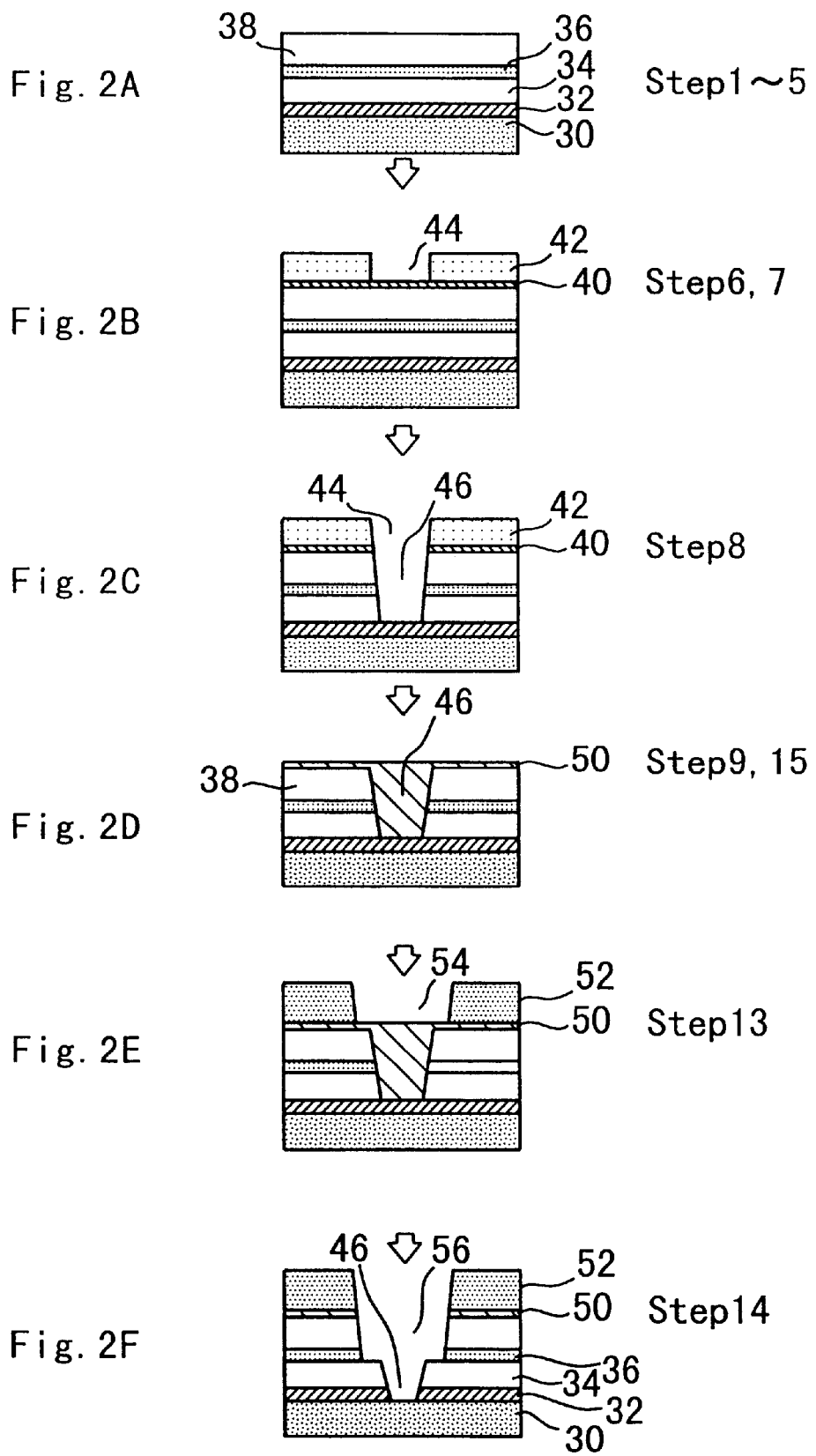

Step1~5

Step6, 7

Step8

Step9, 15

Step13

Step14

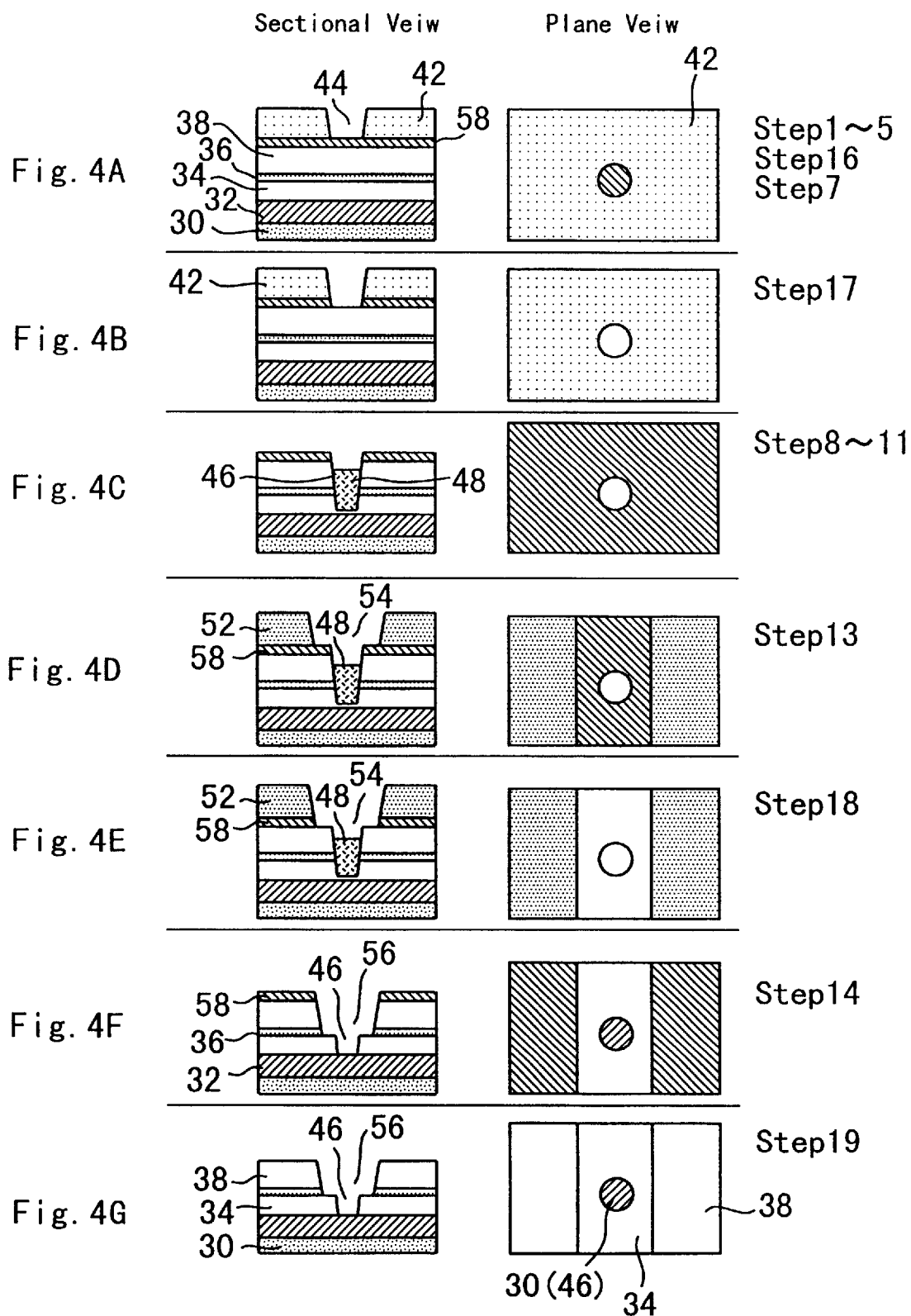

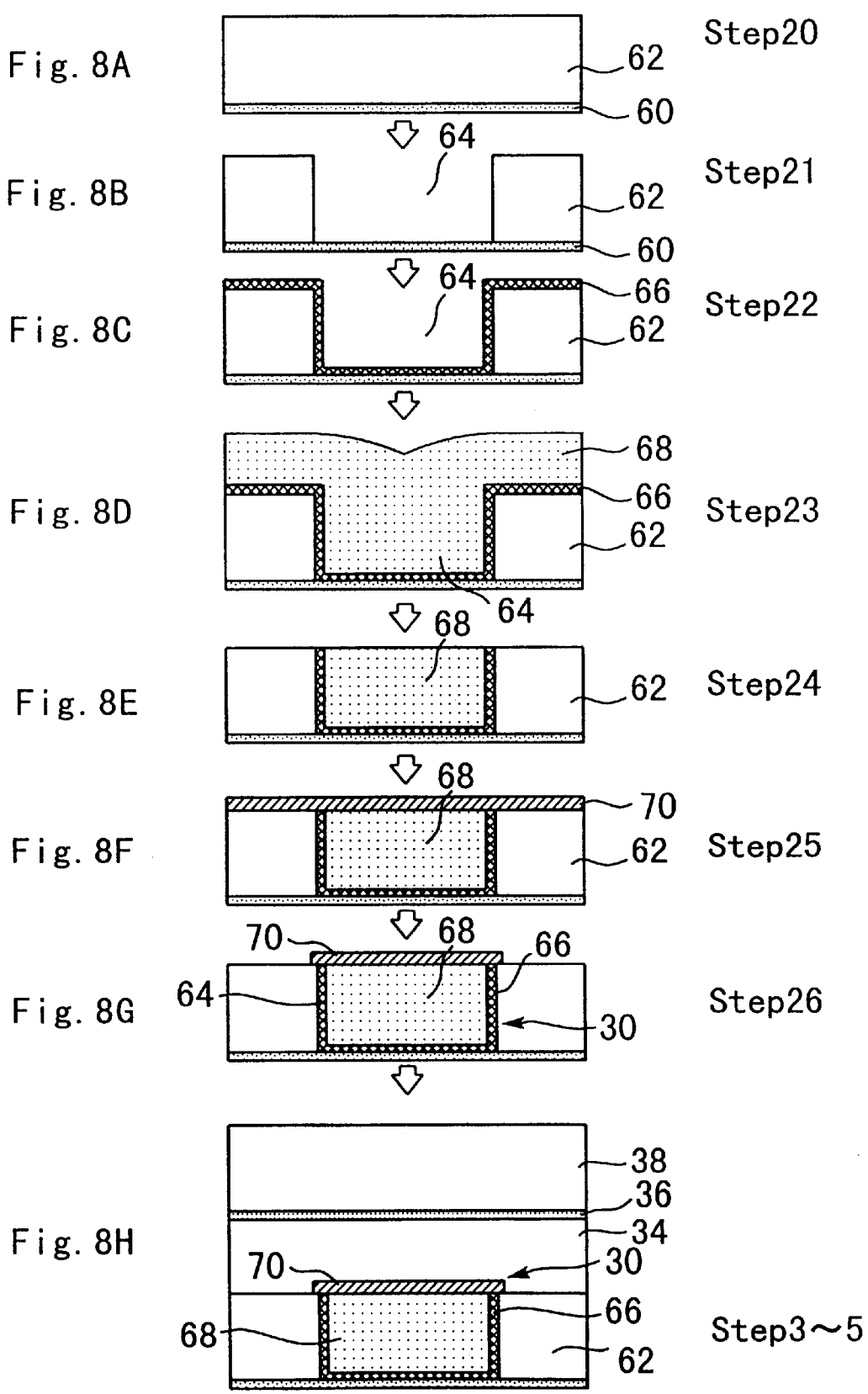

Step24

Step27

Step25

Step28

Step3~5

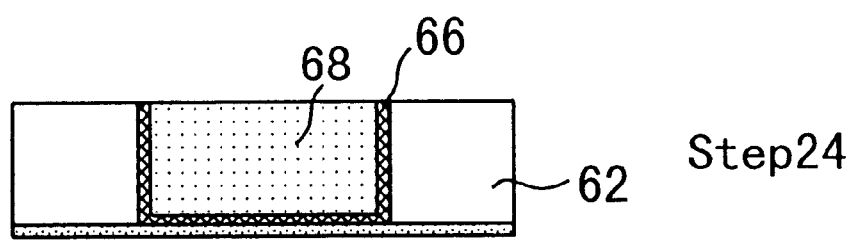
Fig. 10A  Step24
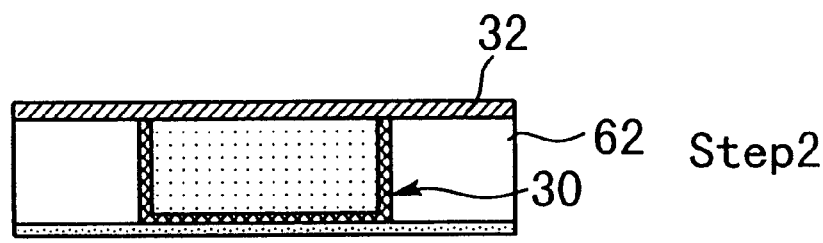
Fig. 10B  Step2
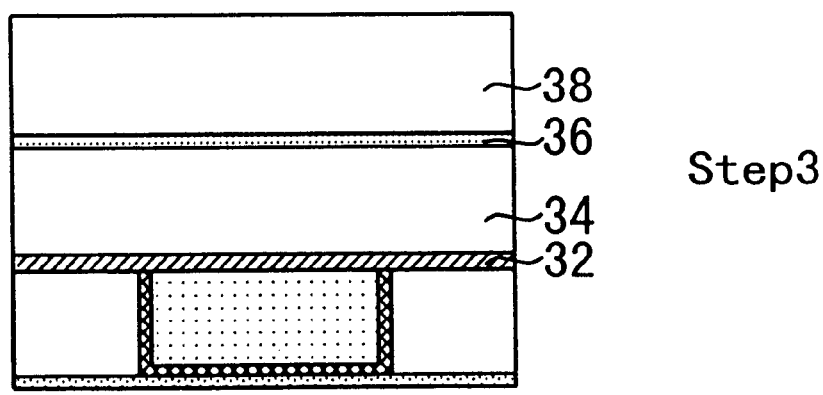
Fig. 10C  Step3

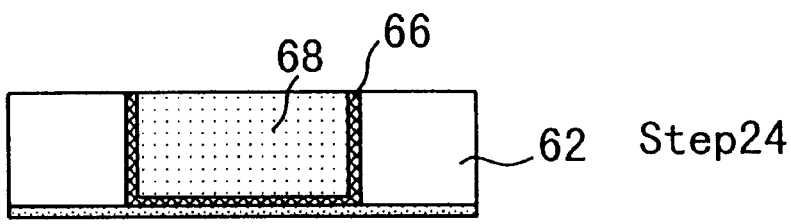
Fig. 11A  Step24
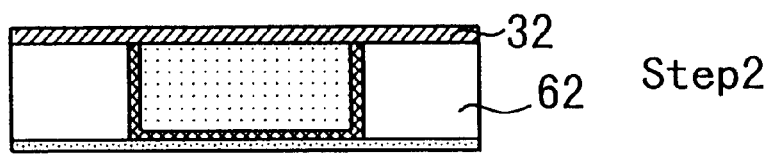
Fig. 11B  Step2
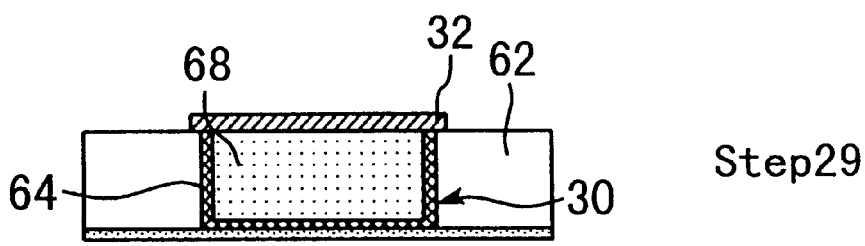
Fig. 11C  Step29
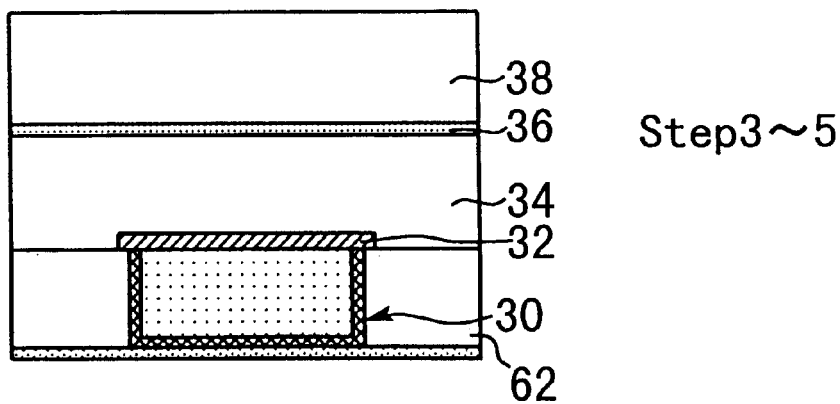
Fig. 11D  Step3~5

Step24

Step27

Step2

Step30

Step3~5

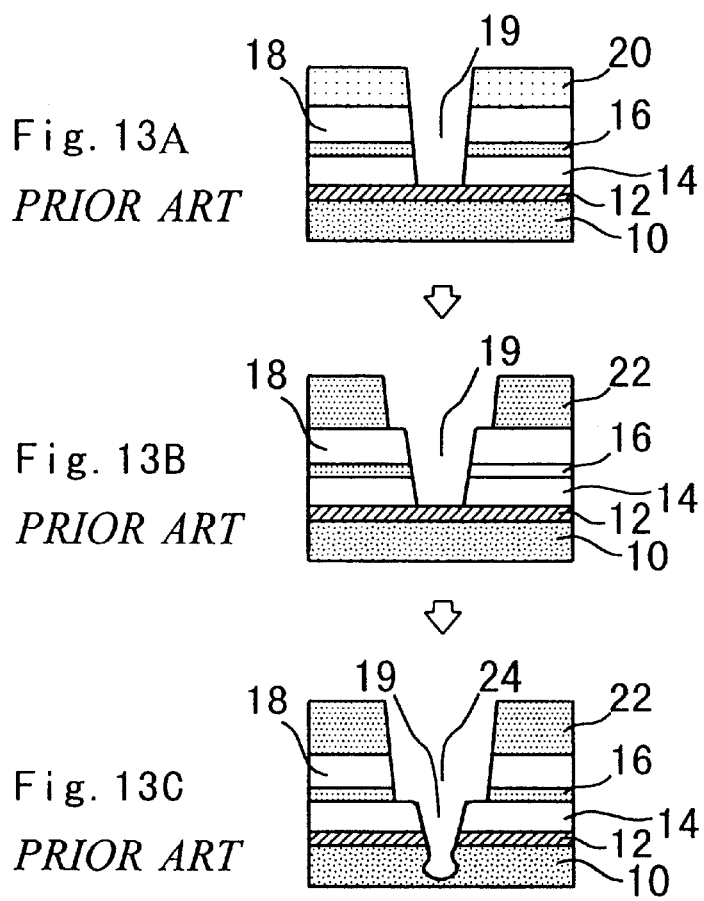
Fig. 13A PRIOR ART
Fig. 13B PRIOR ART
Fig. 13C PRIOR ART
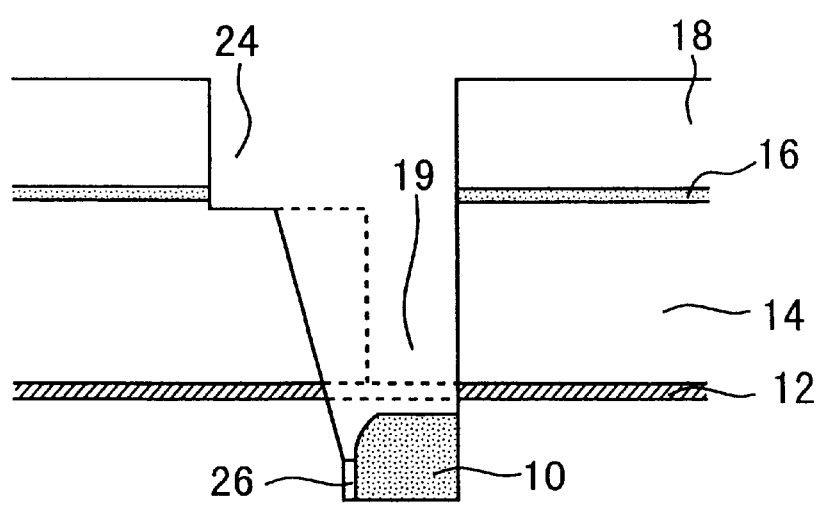
Fig. 14
PRIOR ART

METHOD OF MANUFACTURING A SEMICONDUCTOR DEVICE

BACKGROUND OF THE INVENTION

1. Field of the Invention

The present invention generally relates to a method of manufacturing a semiconductor device, and more particularly to a method of manufacturing a semiconductor device comprising a wiring element having dual damascene structure formed on a lower wiring layer.

2. Description of the Background Art

A wiring pattern of a semiconductor device is often made from a low resistance material such as copper. A multilayer wiring pattern formed from copper usually employs a dual damascene structure; that is, a structure made by forming via holes and wiring trenches in an interlayer dielectric film and then filling the via holes and the wiring trenches with metal.

FIGS. 13A to 13C show cross-sectional views for describing a method of manufacturing a former semiconductor device having a wiring pattern of dual damascene structure.

According to the former manufacturing method, after formation of a trench etch stopper film and a base dielectric film in predetermined locations on a silicon substrate, a lower wiring layer 10 is formed from copper illustratively, through photolithography and etching. A first silicon nitride ($Si_3N_4$) film 12, a first silicon oxide film 14, a second silicon nitride ($Si_3N_4$) film 16, and a second silicon oxide film 18 are formed, in this sequence, on the lower wiring layer 10. Further, a first photoresist film 20 is formed on the second silicon oxide film 18 in such a way as to have an opening corresponding to a via hole 19.

A semiconductor wafer is then subjected to anisotropic dry etching for opening the via hole 19 while the first photoresist film 20 is used as a mask. The etching is carried out until the first silicon nitride film 12 becomes exposed within the via hole 19 (FIG. 13A). During the etching, the first silicon nitride film 12 acts as an etch stopper.

After completion of the etching for the purpose of opening the via hole 19, the first photoresist film 20 is removed from the second silicon oxide film 18. In place of the first photoresist film 20, a second photoresist film 22 is formed on the second silicon oxide film 18 in such a way as to have an opening corresponding to a wiring trench (FIG. 13B).

The semiconductor wafer is subjected to anisotropic dry etching for forming a wiring trench 24 while the second photoresist film 22 is used as a mask (FIG. 13C). This etching is carried out under conditions such that the silicon oxide film can be removed at a great etching selective ratio with respect to the silicon nitride film. At this time, the first and second silicon nitride films 12 and 16 are used as etch stopper films. The semiconductor wafer is further subjected to etching for the purpose of removing the second silicon nitride film 16 and the first silicon nitride film 12 exposed within the via hole 19. After the etching has been performed correctly, there are formed the via hole 19 through which the surface of the lower wiring layer 10 is exposed and the wiring trench 24 which connects with the via hole 19.

During the etching for the purpose of forming the wiring trench 24, the first silicon nitride film 12 is constantly exposed to etchant at the bottom of the via hole 19 (the area of the silicon nitride film 12 that is exposed to etchant will be hereinafter referred to as an "exposed portion"). Because of variations in manufacturing conditions, the exposed portion may be etched in large amounts during the process of etching for the purpose of opening the via hole 19. Under such a condition, the via hole 19 may pass through the first silicon nitride film 12 during the course of etching for opening the wiring trench 24, thereby resulting in exposure of the surface of the lower wiring layer 10. In this case, as shown in FIG. 13C, the lower wiring layer 10 will be damaged if the etching continues further even after exposure of the lower wiring layer 10.

As mentioned above, under the former manufacturing method, the etching for the purpose of opening the wiring trench 24 is carried out after opening of the via hole 19. In this case, the first silicon oxide film 14 and the second silicon nitride film 16 are more susceptible to etching at the vicinity of the opening end of the via hole 19 than at the remaining portions of the same. For this reason, under the former manufacturing method, the through-hole (i.e., the via hole 19) formed in the second silicon nitride film 16 is apt to be increased in diameter during the process of etching for opening the wiring trench 24.

FIG. 14 shows the through-hole formed in the second silicon nitride film 16. The diameter of the through-hole is enlarged during the course of etching. In FIG. 14, a profile indicated by a broken line depicts an ideal shape of the through-hole, which would be obtained when the first and second silicon nitride films correctly act as stopper films. In FIG. 14, the lower wiring layer 10 has a width which is substantially equal to the diameter of the ideal via hole 19, and a barrier metal layer 26 is formed around the lower wiring layer 10.

As shown in FIG. 14, if the through hole of the second silicon nitride film 16 is increased in diameter during the process of formation of the wiring trench 24, the via hole 19 is formed so as to tapers toward the bottom. If the via hole 19 is tapered, the side surface of the lower wiring layer 14 becomes more apt to be exposed to etchant. As a result, the barrier metal layer 26 is damaged under the influence of the etching, and the primary metal contained in the wiring layer is likely to be exfoliated from the barrier metal layer 26. In this way, the former semiconductor device manufacturing method encounters a problem of the lower wiring layer 10 being subjected to various types of damage during formation of a wiring element having dual damascene structure on the lower wiring layer 10.

Copper used as the primary metal of the wiring layer in the former semiconductor device has a higher reflectivity than that of aluminum. According to the former manufacturing method, at the time of patterning of the first photoresist film 20 for opening the via hole 19 (see FIG. 13A) and at the time of pattering of the second photoresist film 22 for forming the wiring trench 24 (see FIG. 13B), the photoresist films are sensitized through exposure to light (e.g., I-lay) irradiated from above. The photoresist is sensitized by the direct light irradiated from above and reflected light that is reflected by the substrate after passage through the photoresist. Therefore, the sensitized state of the photoresist is greatly affected by interference between the direct light and the reflected light.

A silicon oxide film and a silicon nitride film used in the former semiconductor device usually permit passage of light. Therefore, some of the light that has passed through the photoresist passes through the silicon oxide film and the silicon nitride film, thus arriving at the lower wiring layer 10 and the surface of the silicon substrate. As a result, the photoresist formed above the lower wiring layer 10 receives the light reflected by the lower wiring layer 10. The photoresist formed above the locations where the lower wiring layer 10 is not present receives the light reflected from the surface of the silicon substrate laid beneath the lower wiring layer 10.

The optical path along which the light reflected from the lower wiring layer 10 arrives at the photoresist changes according to variations in the thickness of the interlayer dielectric film interposed between the light-reflecting surface and the photoresist. Similarly, the optical path along which the light reflected from the surface of the silicon substrate arrives at the photoresist change according to variations in the thickness of the interlayer dielectric film interposed between the light-reflecting surface and the photoresist. Further, in the event of variations in these optical paths, the state of interference between the direct light and the reflected light changes, thus resulting in variations in the photosensitive state of the photoresist. In this respect, the former manufacturing method is apt to cause deterioration of dimensional accuracy of the first and second photoresist films 20 and 22 because of variations in the thickness of the interlayer dielectric film.

Further, in a case where metal having high reflectivity, such as copper, is used as the primary metal of the lower wiring layer 10, the light that has passed through the mask may be intensively reflected by the lower wiring layer 10, thereby resulting in halation. Under the former manufacturing method, at the time of patterning the first or second photoresist film 20 or 22, defects may arise in the pattern of the photoresist film due to the halation. As set forth, the former manufacturing method poses a problem of being apt to deteriorate the accuracy of the pattern under the influence of the reflected light when the photoresist films are patterned through photolithography.

SUMMARY OF THE INVENTION

The present invention has been conceived to solve the previously-mentioned problems, and a general object of the present invention is to provide a novel and useful method of manufacturing a semiconductor device.

A more specific object of the present invention is to provide a method of manufacturing a semiconductor device method which enables a wiring element to be formed in dual damascene structure on a lower wiring layer without involving damage to the lower wiring layer.

The above object of the present invention is achieved by a method of manufacturing a semiconductor device described as follows. Under the manufacturing method, a film for preventing diffusion of metal is formed on a lower wiring layer. A first dielectric film is formed on the metal diffusion prevention film. An etch stopper film is formed on the first dielectric film. A second dielectric film is formed on the etch stopper film. After formation of the films, a via hole is opend at a position above the lower wiring layer so as to pass through the second dielectric film, the etch stopper film, and the first dielectric film. An organic layer is deposited within the via hole so as to cover the internal wall surface of the via hole. After formation of the organic layer, a wiring trench is provided by etching away a predetermined portion of the second dielectric film while using the organic layer as a protective film.

Other objects and further features of the present invention will be apparent from the following detailed description when read in conjunction with the accompanying drawings.

BRIEF DESCRIPTION OF THE DRAWINGS

FIGS. 1A to 1F are cross-sectional views for describing a method of manufacturing a semiconductor device according to a first embodiment of the present invention;

FIGS. 2A to 2F are cross-sectional views for describing a method of manufacturing a semiconductor device according to a second embodiment of the present invention;

FIGS. 4A to 4G are cross-sectional views for describing a method of manufacturing a semiconductor device according to a fourth embodiment of the present invention;

FIGS. 8A to 8H are cross-sectional views for describing principle processes of a method of manufacturing a semiconductor device according to a sixth embodiment of the present invention;

FIGS. 10A to 10C are cross-sectional views for describing principle processes of a method of manufacturing a semiconductor device according to a eighth embodiment of the present invention;

FIGS. 11A to 11D are cross-sectional views for describing principle processes of a method of manufacturing a semiconductor device according to a ninth embodiment of the present invention;

FIGS. 13A to 13C are cross-sectional views for describing principle processes of a former manufacturing method of a semiconductor device; and FIGS. 14 is a cross-sectional view for describing a problem of the former manufacturing method of a semiconductor device.

DESCRIPTION OF THE PREFERRED EMBODIMENTS

Figure 3A:
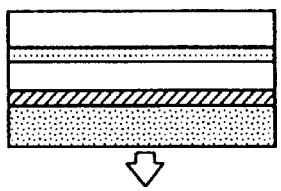
FIGS. 3A to 3F are cross-sectional views for describing a method of manufacturing a semiconductor device according to a third embodiment of the present invention.
Figure 3B:
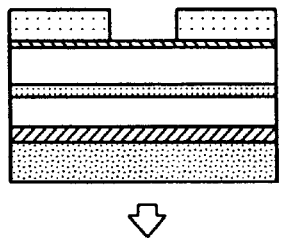
Figure 3C:
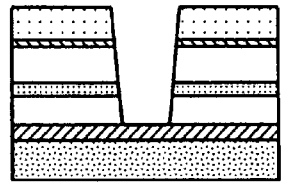

In the following, principles and embodiments of the present invention will be described with reference to the accompanying drawings. The members and steps that are common to some of the drawings are given the same reference numerals and redundant descriptions therefor may be omitted.

First Embodiment

FIGS. 1A to 1F are cross-sectional views for describing a method of manufacturing a semiconductor device according to a first embodiment of the present invention.

As shown in FIG. 1A, under the manufacturing method according to the first embodiment, a lower wiring layer 30 is formed at first. The layer 30 is formed in a lower wiring trench (not shown) formed in a silicon substrate (step 1). The lower wiring layer 30 has a film thickness of 13000 angstroms and is formed from copper which serves as the primary metal material.

A first silicon nitride film 32 having a thickness of 600 angstroms (step 2), a first silicon oxide film 34 having a thickness of 12000 angstroms (step 3), a second silicon nitride film 36 having a thickness of 3600 angstroms (step 4), and a second silicon oxide film 38 having a thickness of 13000 angstroms (step 5) are formed, in this sequence, on the lower wiring layer 30.

As shown in FIG. 1B, a first organic antireflective film 40 (hereinafter referred to a "first Bottom Anti-reflective Coating" or a "first BARC") formed from known organic antireflective material is applied over the top of the second silicon oxide film 38 (step 6). A first photoresist film 42 is formed on the first BARC 40 through photolithography (step 7) so as to have an opening 44 at a position corresponding to a position where a via hole is to be formed.

At the time of patterning of the first photoresist film 42, the first photoresist film 42 is irradiated with light while a mask is superimposed on the first photoresist film 42. The majority of the light that has passed through the first photoresist film 42 is reflected by the first BARC 40. In this case, the length of the optical path of the reflected light becomes constant regardless of variations in the thickness of an interlayer dielectric film, so that interference between the direct light and the reflected light that are received by the first photoresist film 42 becomes always substantially constant. Under the aforementioned conditions, intensive reflected light is not produced by the lower wiring layer 30, thus effectively preventing halation during photolithography. For this reason, the processing of step 7 enables the first photoresist film 42 to be patterned with superior dimensional accuracy.

As shown in FIG. 1C, a semiconductor wafer is subjected to anisotropic dry etching to open a via hole 46 (step 8). The semiconductor wafer is initially etched under conditions suitable for removal of silicon oxide, so that the second silicon nitride film 36 becomes exposed at the bottom of the via hole 46. Subsequently, the semiconductor wafer is etched under conditions suitable for removal of silicon nitride, so that the first silicon oxide film 34 becomes exposed at the bottom of the via hole 46. The semiconductor wafer is again etched under conditions suitable for removal of silicon oxide, so that the first silicon nitride film 32 becomes exposed at the bottom of the via hole 46.

The conditions for step 8 are set in such a way that the via holes 46 in all the areas of the semiconductor wafer are correctly formed; namely, the conditions are set so that the first silicon nitride film 32 becomes exposed at the bottom of each of the via holes 46. More specifically, the extent of overetching is determined such that the first silicon nitride film 32 becomes exposed at the bottom of each of all the via holes 46. In the first silicon nitride film 32, some portions of the first silicon nitride film 32 that have become exposed within respective via holes 46 at a comparatively early time act as etch stopper films over a long period of time during the overetching process. In this case, these portions of film that have served as etch stopper films may become apparently thinner than the remaining portions of the first silicon nitride film 32 at the time of completion of the etching for opening the via holes 46.

As shown in FIG. 1D, after completion of the etching for the purpose of opening the via hole 46, the first photoresist film 42 is removed (step 9). Subsequently, the via hole 46 is filled with a photoresist film 48 (step 10). The photoresist film 48 is provided so as to cover at least the internal area of the via hole 46 from the bottom thereof to the position beyond the second silicon nitride film 36. The photoresist film 48 becomes set upon exposure to irradiation with Deep UV-ray at an illumination intensity of 600 mW/cm$^2$ for 120 sec. on a hot plate at a temperature of 150° C. (step 11). A second BARC 50 is applied over the second silicon oxide film 38 and the thus-hardened photoresist film 48 (step 12).

As shown in FIG. 1E, a second photoresist film 52 is formed on the second BARC 50 through use of photolithography (step 13) so as to have an opening 54 at a position corresponding to a location where a wiring trench is to be formed. At the time of patterning of the second photoresist film 52, the second photoresist film 52 is irradiated with light while a mask is superimposed thereon. The majority of the light that has passed through the second photoresist film 52 is reflected from the second BARC 50. Thus, the processing of step 13 enables prevention of a difference in the optical paths of the direct light and the reflected light as well as of the halation, thereby enabling the second photoresist film 52 to be patterned with superior dimensional accuracy.

As shown in FIG. 1F, the semiconductor wafer is subjected to anisotropic dry etching for the purpose of opening a wiring trench 56 (step 14). The etching performed in step 14 is started under conditions suitable for removal of silicon oxides. As a result, the wiring trench 56 is formed until the second silicon nitride film 36 is exposed. Next, the semiconductor wafer is subjected to etching under conditions suitable for removal of silicon nitrides, thereby resulting in removal of the exposed portion of the first silicon nitride film 32. As a result, the surface of the lower wiring layer 30 is exposed within the via hole 46, as well as the second silicon nitride film 36 that remains at the bottom of the wiring trench 56 is eliminated. After completion of the processing of step 14, the photoresist film 48 that remains within the via hole 46 and the second photoresist film 52 that remains above the second silicon oxide film 38 are simultaneously removed through an ashing process.

The previously-described etching is carried out while the inside of the via hole 46, i.e., the exposed portion of the first silicon nitride film 32 and the sidewall surface of the through-hole (the hole constituted of the via hole 46) of the second nitride film 36, is protected by the photoresist film 48. Even if the exposed portion of the first silicon nitride film 32 is evidently thinner than the remaining portion of the first silicon nitride film 32 upon completion of opening of the via hole 46, the via hole 46 is prevented from passing through the first silicon nitride film 32 at an improperly early time, and the upper end of the via hole 46 is prevented from excessively becoming enlarged. Thus, the manufacturing method according to the first embodiment enables formation of a wiring element of dual damascene structure without involvement of damage to the lower wiring layer 30.

In the first embodiment, the photoresist film 48 provided in the via hole 46 is exposed to irradiation with Deep UV-ray in order to set the photoresist film 48. The method for setting the photoresist film 48 is not limited to the foregoing method. For instance, the photoresist film 48 may be set through, e.g., hard baking (heating) or a combination of irradiation with Deep UV and hard baking.

Second Embodiment

A semiconductor device manufacturing method according to a second embodiment of the present invention will be described by reference to FIGS. 2A to 2F. FIGS. 2A to 2F are cross-sectional views for describing a method of manufacturing a semiconductor device according to the second embodiment. As shown in FIGS. 2A to 2C, under the manufacturing method according to the second embodiment, the via hole 46 is manufactured by carrying out the processing of steps 1 through 8, as in the case of the first embodiment.

As shown in FIG. 2D, under the manufacturing method according to the second embodiment, after removal of the first photoresist film 42 (step 9), the second BARC 50 layer is formed inside the via hole 46 and on the second silicon oxide film 38 (step 15). After the foregoing steps, a wiring trench 56 is formed by carrying out the processing of steps 13 and 14, as in the case of the first embodiment.

Under the manufacturing method according to the second embodiment, the second BARC 50 acts as an antireflective film at the time of patterning of the second photoresist film 52, as well as acting as a protective film similar to the photoresist film 48 used in the first embodiment, during the process of etching for the purpose of forming the wiring trench 56. Therefore, under the second embodiment, an advantageous result similar to that yielded in the first embodiment may be yielded through a process simpler than that of the first embodiment.

Third Embodiment

A third embodiment of the present invention will now be described by reference to FIGS. 3A to 3F. FIGS. 3A to 3F are drawings for describing a method of manufacturing a semiconductor device according to the third embodiment. The manufacturing method according to the third embodiment is identical to that of the second embodiment except that an organic antireflective agent used as the material for the second BARC 50 is inferior in embedded ability to that used in the second embodiment.

Figure 3D:
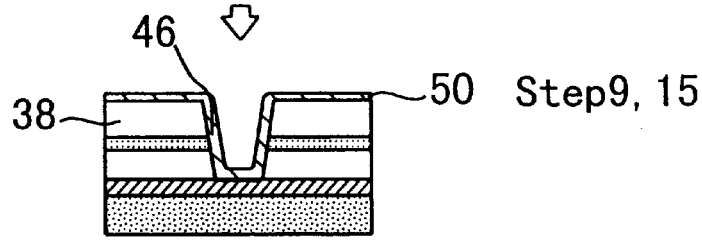
Figure 3E:
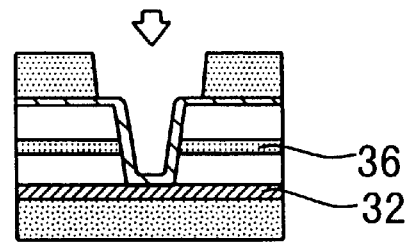
Figure 3F:
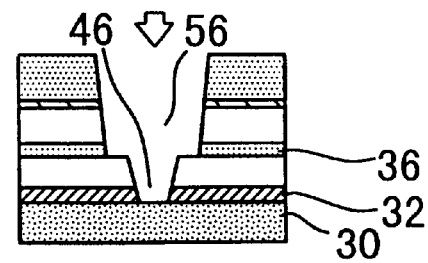

More specifically, under the second embodiment, the second BARC 50 is formed through use of an organic antireflective agent having superior embedded ability. Therefore, the second BARC 50 is embedded throughout the inside of the via hole 46. In contrast, under the manufacturing method according to the third embodiment, the second BARC 50 is formed through use of an organic antireflective agent having inferior embedded ability, so that the second BARC 50 is formed so as to cover solely the wall surface of the via hole 46 (FIG. 3D).

Even when formed so as to cover solely the wall surface of the via hole 46, the second BARC 50 effectively protects an exposed portion of the first silicon nitride film 32 and the portion in the vicinity of the through-hole of the second silicon nitride film 36, during the process of the etching for the purpose of forming the wiring trench 56. Accordingly, even under the third embodiment, a wiring element of dual damascene structure can be formed on the lower wiring layer 30 without involving damage to the lower wiring layer 30, as in the case of the first and second embodiments.

Fourth Embodiment

A fourth embodiment of the present invention will now be described by reference to FIGS. 4A to 4G. FIGS. 4A to 4G are views (cross-sectional views provided in the left column and top views provided in the right column) for describing a method of manufacturing a semiconductor device according to the fourth embodiment.

As shown in FIG. 4A, under the manufacturing method according to the fourth embodiment, the lower wiring layer 30, the first silicon nitride film 32, the first silicon oxide film 34, the second silicon nitride film 36, and the second silicon oxide film 38 are formed, in this sequence, through the processing of steps 1 to 5, as in the case of the first embodiment.

In the fourth embodiment, the first and second silicon oxide films 34 and 38 contain 3%–4% fluorine. In contrast with a silicon oxide film which does not contain fluorine, the silicon oxide film exhibits a low dielectric constant. The first and second silicon nitride films 32 and 36 correspond to $Si_3N_4$ films that are widely used for passivation. That is, the films 32 and 36 are made of films which are composed of silicon and nitrogen in proportions of 3:4. The richer silicon nitride film is in silicon, the higher an absorption factor thereof. In contrast, the richer the silicon nitride film is in nitrogen, the lower the dielectric constant thereof. A silicon nitride film such as used in the fourth embodiment, i.e., a silicon nitride film that contains nitrogen in higher proportion may reduce the dielectric constant thereof, although being unable to ensure an enough absorption factor. Accordingly, the structure of the semiconductor device according to the fourth embodiment may enable the storage capacity of the wiring in the semiconductor device to be reduced to a sufficiently small value.

A high-melting-point metal film 58 having a thickness of 600 to 1000 angstroms or thereabouts is formed on the second silicon nitride film 38 (step 16). According to the fourth embodiment, a titanium nitride film is used as the metal film 58. On the metal film 58 is formed the first photoresist film 42 through photolithography, as in the case of the first embodiment (step 7).

The majority of the light that passes through the first photoresist film 42 at the time of photolithography thereof is reflected by the high-melting-point metal film 58. Thus, according to the fourth embodiment, in spite of no BARC being formed at a position below the first photoresist film 42 as well as the first and second silicon nitride films 32 and 36 having comparatively low absorption factors, the first photoresist film 42 can be patterned with superior accuracy without arising the halation of the reflected light and the difference in optical paths.

As shown in FIG. 4B, the high-melting-point metal film 58 that is exposed within the opening 44 of the first photoresist film 42 is etched away (step 17).

Next, as shown in FIG. 4C, the via hole 46 is formed by carrying out the processing of steps 8 to 11 in the same manner as in the first embodiment, whereby the via hole 46 is formed, and the photoresist film (organic layer) 48 is formed within the via hole 46.

After completion of the processing of step 11 (i.e., removal of the first photoresist film 42), the second photoresist film 52 is formed on the high-melting-point metal film 58 by carrying out the processing of step 13. The majority of the light that passes through the inside of the second photoresist film 52 at the time of photolithography is reflected by the high-melting-point metal film 58, as in the case of the photolithography of the first photoresist film 42. Under the manufacturing method according to the fourth embodiment, in spite of no BARC being formed at a position below the second photoresist film 52, the second photoresist film 52 can be patterned with superior accuracy without arising the halation of the reflected light or the difference in optical paths.

As shown in FIG. 4E, under the manufacturing method according to the fourth embodiment, the high-melting-point metal film 58 that is exposed within the opening 54 of the second photoresist is etched away (step 18).

As shown in FIG. 4F, the wiring trench 56 is formed through the processing of step 14, as in the case of the first embodiment. Etching for the purpose of creating the wiring trench 56 is performed while the exposed portion of the first silicon nitride film 32 and the area in the vicinity of the through-hole of the second silicon nitride film 36 are protected by the photoresist film 48. Consequently, under the manufacturing method according to the fourth embodiment, a wiring element of dual damascene structure can be formed on the lower wiring layer 30 with a high degree of accuracy without involving damage to the lower wiring layer 30.

When the second photoresist film 52 is removed through an ashing process after formation of the wiring trench 56, the high-melting-point metal film 58 is eliminated from a position above the second silicon oxide film 38 through wet etching, as shown in FIG. 4G (step 19) After completion of the processing, a wiring element of desired structure can be obtained, as in the case of the first embodiment.

Figures 5A, 5B:
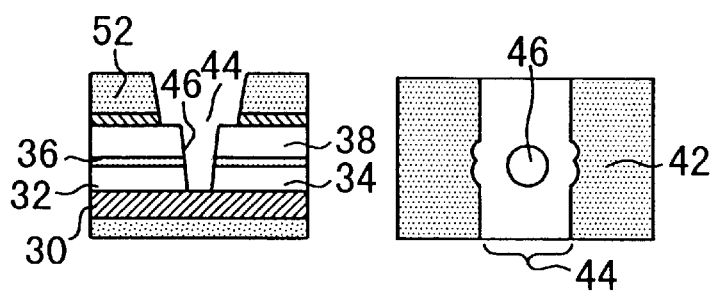
FIG. 5A is a cross-sectional view of a semiconductor device manufactured by a method contrasted with the fourth embodiment.
FIG. 5B is a top view of the semiconductor device manufactured by the method contrasted with the fourth embodiment.

FIG. 5A is a cross-sectional view of a semiconductor device manufactured by a method contrasted with the manufacturing method according to the fourth embodiment. FIG. 5B is a top view of the thus-manufactured semiconductor device. More specifically, FIGS. 5A and 5B show the semiconductor device, in which the second photoresist film 52 is formed without formation of the high-melting-point metal film 58 at a position above the second silicon oxide film 38.

Figure 6:
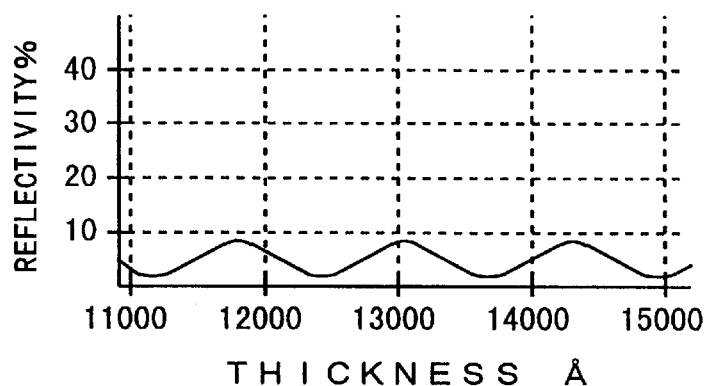
FIG. 6 is a graph showing a relationship between a reflectivity and a thickness of an interlayer dielectric film obtained by the semiconductor device shown in FIGS. 5A and 5B.
Figure 7:
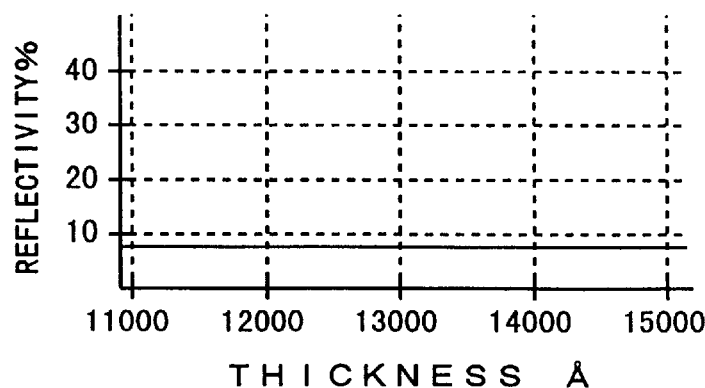
FIG. 7 is a graph showing a relationship between a reflectivity and a thickness of an interlayer dielectric film obtained by a semiconductor device having a high-melting-point metal film for antireflection purpose.

FIG. 6 is a graph showing the relationship between the thickness of an interlayer dielectric film (e.g., films 32 to 38) and the reflectivity obtained when the semiconductor device shown in FIGS. 5A and 5B is exposed to the light (i.e., I-ray) irradiated from above the second silicon oxide film 38. FIG. 7 is a graph showing the relationship between the thickness of an interlayer dielectric film and the reflectivity obtained when the semiconductor device shown in FIGS. 4A to 4G is exposed to the light (i.e., I-ray) irradiated from above the high-melting-point metal film 58.

If the high-melting-point metal film 58 is not formed on the surface of the second silicon oxide film 38, the light irradiated toward the semiconductor device passes through the interlayer dielectric films and is reflected by the silicon substrate and the lower wiring layer 30. In this case, according to the thickness of the interlayer dielectric films, the optical path of the reflected light varies in length, so that the interference state between the direct light and the reflective light varies. To this end, the reflectivity changes as shown in FIG. 6 according to the thickness of the interlayer insulating films. For this reason, if the high-melting-point metal film 58 is not formed on the surface of the second silicon oxide film 38, the photosensitivity of the second photoresist film 52 is apt to be affected by variations in the thickness of the interlayer dielectric films.

Further, if the high-melting-point metal film 58 is not formed on the surface of the second silicon oxide film 38, intensive light is reflected from the lower wiring layer 30, thereby resulting in halation at the time of photolithography of the second photoresist film 52. For this reason, as shown in FIG. 5B, if the high-melting-point metal film 58 is not formed on the second silicon oxide film 38, a pattern error is apt to arise in the opening 44 of the second photoresist film 52.

In contrast, if the high-melting-point metal film 58 is formed on the surface of the second silicon oxide film 38, the light radiated toward the semiconductor device is reflected by the metal film 58. Therefore, as shown in FIG. 7, even in the event of variations in the thickness of the interlayer dielectric films (32 to 38), the optical reflectivity is maintained at a substantially constant value. Further, in this case, the irradiated light does not reach the lower wiring layer 30, thus eliminating the possibility of halation. Therefore, as shown in FIG. 4D, under the manufacturing method according to the fourth embodiment, the second photoresist film 52 can be formed with superior accuracy.

As mentioned above, under the manufacturing method according to the fourth embodiment, the high-melting-point metal film 58 that is formed on the surface of the second silicon oxide film 38 acts as an ARC for preventing reflection of light, which would cause a pattern error. Further, if the high-melting-point metal film 58 is used as an ARC, there can be eliminated a necessity for growing an ARC every time the first and second photoresist films 42 and 52 are formed in contrast with the case of the first through third embodiments. For this reason, the manufacturing method according to the fourth embodiment enables manufacture, through simple processes, of a semiconductor device having a high degree of profile accuracy.

Fifth Embodiment

A fifth embodiment of the present invention will now be described. A semiconductor device manufacturing method according to the fifth embodiment is implemented by use, as the high-melting-point metal film 58 employed in the fourth embodiment, of a silicon nitride film having an absorption factor of 0.5 to 1.0, i.e., a SiN film containing silicon and nitrogen in proportions of 1:1. The silicon nitride film acts as an ARC on the second silicon oxide film 38 likewise the high-melting-point metal film 58. Therefore, even under the manufacturing method according to the fifth embodiment, a semiconductor device having superior accuracy may be formed, as in the case of the fourth embodiment.

In contrast with the high-melting-point metal film 58, the silicon nitride film is an dielectric film. Accordingly, elimination of the silicon nitride film formed on the second silicon oxide film 38 is not necessarily required. Therefore, under the manufacturing method according to the fifth embodiment, processing steps may be made more simple than those in the fourth embodiment.

Sixth Embodiment

A sixth embodiment of the present invention will now be described by reference to FIGS. 8A to 8H. FIGS. 8A to 8H are cross-sectional views for describing the principal processes of a semiconductor device manufacturing method according to the sixth embodiment.

As shown in FIG. 8A, under the manufacturing method according to the sixth embodiment, a silicon oxide film 62 is formed by CVD to a thickness of 13000 angstroms on a silicon nitride film 60 having a thickness of 600 angstroms (step 20).

As shown in FIG. 8B, a lower wiring trench 64 is patterned in the silicon oxide film 62 through photolithography and anisotropic etching (step 21).

As shown in FIG. 8C, a high-melting-point metal film 66 is formed on the silicon oxide film 62 and inside the lower wiring trench 64, through sputtering or CVD (step 22). The high-melting-point metal film 66 is formed to a thickness of about 500 to 1000 angstroms from titanium, titanium nitride, tantalum, or tantalum nitride.

As shown in FIG. 8D, a primary metal material film 68 is formed to a thickness of 15000 to 20000 angstroms on the high-melting-point metal film 66 (including the inside of the lower wiring trench 64) by sputtering, CVD, plating, or a combination thereof (step 23). According to the sixth embodiment, the primary metal material film 68 is formed from copper.

As shown in FIG. 8E, the surface of the primary metal material film 68 and that of the high-melting-point metal film 66 are smoothed by chemical-and-mechanical polishing or total etch back (step 24).

As shown in FIG. 8F, a high-melting-point metal film 70 having a thickness of about 100 to 1000 angstroms is formed on the thus-smoothed silicon oxide film 62 and the primary metal material film 68 by deposition of titanium by use of a technique identical with that used in step 22 (step 25).

As shown in FIG. 8G, a portion of the high-melting-point metal film 70 which does not overlay the primary metal material film 68 or the high-melting-point metal film 66 is removed by photolithography and etching (step 26). Through the above-mentioned processing, only the portion of the high-melting-point metal film 70 that corresponds to the lower wiring trench 64 is left. As a result, the lower wiring layer 30 is formed from the primary metal material film 68 and the high-melting-point metal films 66 and 70. During the processing of step 26, the photolithography is carried out through use of the mask (or reticle) used for patterning the lower wiring trench 64 (see step 21) and the photoresist which is opposite in polarity to the photoresist used for the patterning of the lower wiring trench 64.

As shown in FIG. 8H, the first silicon oxide film 34, the second silicon nitride film 36, and the second silicon oxide film 38 are formed, in this sequence, on the silicon oxide film 62 and the lower wiring layer 30 through the processing of steps 3 to 5, as in the case of the first through fifth embodiments. After formation of the foregoing films, processing operations substantially identical with those employed in any one of the first through fifth embodiments are performed, whereby a wiring element of dual damascene is formed on the lower wiring layer 30.

Under the manufacturing method according to the sixth embodiment, the high-melting-point metal material film 70 that covers the primary metal material film 68 acts as an ACR for preventing halation, which would otherwise be caused by reflected light during photolithography of the first or second photoresist film 42 or 52. Further, in the sixth embodiment, the second silicon nitride film 36 is formed from a silicon-rich nitride film having an absorption factor of 0.5 to 1.0; more specifically, the second silicon nitride film 36 is formed from SiN containing silicon and nitrogen in proportions of 1:1. Such a second silicon nitride film 36 can effectively prevent passage of reflected light at the time of photolithography of the first or second photoresist film 42 or 52, thereby effectively preventing halation, which would otherwise be caused by the reflected light.

In the first through fifth embodiments, an organic antireflective film or a high-melting-point metal film is formed on the second silicon oxide film 38 in order to prevent deterioration of pattern accuracy stemming from halation caused by reflected light. In contrast, under the manufacturing method according to the sixth embodiment, the function of the ARC can be implemented by the high-melting-point metal film 70 of the lower wiring layer 30 and the second silicon nitride film 36 as mentioned above. Therefore, even if an ARC to be formed on the second silicon oxide film 38 is omitted, the manufacturing method according to the sixth embodiment enables manufacture of a semiconductor device having a high degree of dimensional accuracy by effectively preventing an error in the accuracy of a pattern, which would otherwise be caused by the reflected light.

Under the manufacturing method according to the sixth embodiment, the high-melting-point metal film 70 that covers the primary metal material film 68 acts as a barrier metal layer for preventing oxidation or diffusion of the primary metal material film 68 (i.e., copper), as well as acting as the ARC. Furthermore, the high-melting-point metal film 70 acts also as a stopper film for preventing progress of etching reaction at the time of etching of the first silicon oxide film 34. For these reasons, the manufacturing method according to the sixth embodiment does not involve any necessity of forming, on the lower wiring layer 30, the first silicon nitride film 32, which is required in the first through fifth embodiments. Omission of the first silicon nitride film 32 may cause a decrease in the dielectric constant of the interlayer dielectric films, which in turn results in a reduction in the storage capacity of the device. Accordingly, in contrast with the manufacturing methods according to the first through fifth embodiments, the manufacturing method according to the sixth embodiment may enable manufacture of a semiconductor device having a small storage capacity.

Seventh Embodiment

A seventh embodiment of the present invention will now be described by reference to FIGS. 9A to 9E. FIGS. 9A to 9E are cross-sectional views for describing the principal processes of a method of manufacturing a semiconductor device according to the seventh embodiment.

Figure 9A:
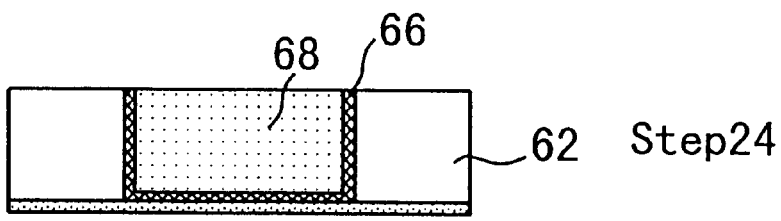
FIGS. 9A to 9E are cross-sectional views for describing principle processes of a method of manufacturing a semiconductor device according to a seventh embodiment of the present invention.

FIG. 9A shows the semiconductor device identical to that shown in FIG. 8E describing the sixth embodiment. As in the case of the sixth embodiment, under the manufacturing method according to the seventh embodiment, the semiconductor device shown in FIG. 9A is manufactured by carrying out the processing of steps 20 to 24.

Figure 9B:
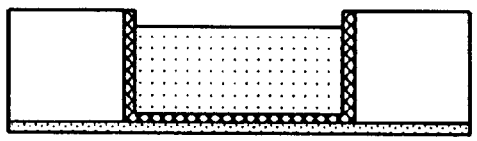

As shown in FIG. 9B, under the manufacturing method according to the seventh embodiment, the surface of the primary metal material film 68 is reduced, through overetching or overpolishing, so as to become lower than the surface of the silicon oxide film 62 by 100 to 1000 angstroms or thereabouts (step 27).

Figure 9C:
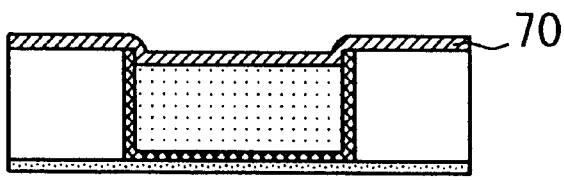

The high-melting-point metal film 70 is formed to a thickness of about 100 to 1000 angstroms on the silicon oxide film 62 or the primary metal material film 68, by means of a technique similar to that used in step 25 according to the sixth embodiment (FIG. 9C).

Figure 9D:
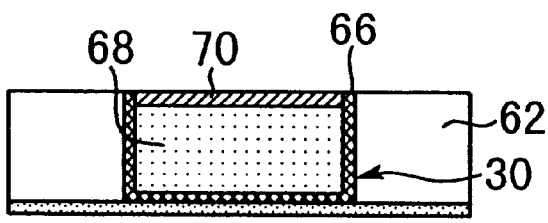
Figure 9E:
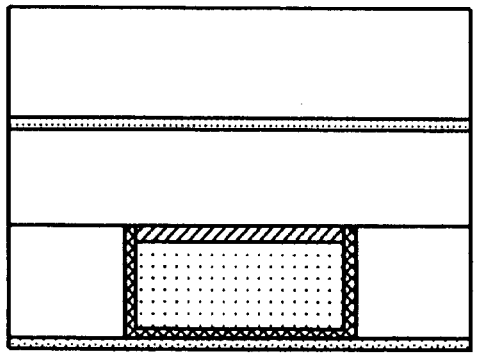

As shown in FIG. 9D, the high-melting-point metal film 70 is smoothed by total etch back or chemical-and-mechanical polishing (CMP) until the surface of the high-melting-point film 70 and the surface of the silicon oxide film 62 become smooth (step 28). Through the foregoing processing, the lower wiring layer 30 is formed in the silicon oxide film 62.

After formation of the lower wiring layer, processing steps identical to those performed in the sixth embodiment are performed, whereby a semiconductor device having a desired construction may be implemented. Under the manufacturing method according to the seventh embodiment, the high-melting-point metal film 70 of the lower wiring layer 30 acts as an ARC, barrier metal, or an etch stopper film, as in the case of the sixth embodiment. Accordingly, even under the seventh embodiment, a semiconductor device having superior dimensional accuracy may be manufactured through simple processing steps as in the case of the sixth embodiment. Further, the seventh embodiment enables the surface of the lower wiring layer 30 and the silicon oxide film 62 to be flat. Thus, under the seventh embodiment, a wiring element may be formed on the lower wiring layer 30 with superior accuracy in a manner simpler than in the sixth embodiment.

Eighth Embodiment

An eight embodiment of the present invention will now be described by reference to FIGS. 10A to 10C. FIGS. 10A to 10C are cross-sectional views for describing the principal processes of a method of manufacturing a semiconductor device according to the eighth embodiment.

FIG. 10A shows a semiconductor device identical to that shown in FIG. 8E according to the sixth embodiment. Under the eighth embodiment, the semiconductor device shown in FIG. 10A is formed by carrying out the processing of steps 20 to 24, as in the case of the sixth embodiment.

As shown in FIG. 10B, in the present embodiment, the first silicon nitride film 32 is formed on the silicon oxide film 62 and the primary metal material film 68 (step 2). The first silicon nitride film 32 in the present embodiment corresponds to a silicon-rich film having an absorption factor of 0.5 to 1.0, i.e., a SiN film containing silicon and nitrogen in proportions of 1:1.

After formation of the first silicon nitride film 32, processing operations identical to those performed in the foregoing sixth and seventh embodiments, whereby a semiconductor device having a desired construction may be implemented. The first silicon nitride film 32 in the present embodiment acts as an ARC, a barrier layer, and an etch stopper as the high-melting-point metal film 70 employed in the sixth or seventh embodiment. For this reason, the manufacturing method according to the eighth embodiment enables manufacture of a semiconductor device having superior dimensional accuracy through simple processing steps.

Ninth Embodiment

A ninth embodiment of the present invention will now be described by reference to FIGS. 11A to 11D. FIGS. 11A to 11D are cross-sectional views for describing the principal processes of a method of manufacturing a semiconductor device according to the ninth embodiment.

FIG. 11A shows a semiconductor device identical to that shown in FIG. 8E according to the sixth embodiment. The semiconductor device shown in FIG. 11A is formed by carrying out the processing of steps 20 to 24, as in the case of the sixth embodiment.

As shown in FIG. 11B, under the ninth embodiment, the first silicon nitride film 32 is formed on the silicon oxide film 62 and the primary metal material film 68 (step 2). The first silicon nitride film 32 in the ninth embodiment corresponds to a silicon-rich film having an absorption factor of 0.5 to 1.0, i.e., a SiN film containing silicon and nitrogen in proportions of 1:1, as in the case of the eighth embodiment (FIGS. 10A to 10C).

As shown in FIG. 11C, the portion of the first silicon nitride film 32 that does not overlay the primary metal material film 68 or the high-melting-point metal film 66 is removed by photolithography or etching (step 29). Through the foregoing processing, only the portion of the first silicon nitride film 32 that corresponds to the lower wiring trench 64 is left. During the processing of step 29, the photolithography is carried out through use of the mask (or reticle) used for patterning the lower wiring trench 64 (see step 21) and the photoresist which is opposite in polarity the photoresist used for the patterning of the lower wiring trench 64.

After formation of the first silicon nitride film 32, processing operations identical to those performed in the foregoing sixth to eighth embodiments are performed, whereby a semiconductor device having a desired construction may be implemented. Under the ninth embodiment, the first silicon nitride film 32 acts as an ARC, a barrier layer, and an etch stopper, as in the eighth embodiment (FIGS. 10A to 10C). For this reason, the manufacturing method according to the ninth embodiment enables manufacture of a semiconductor device having superior dimensional accuracy, through simple processing steps.

According to the ninth embodiment, a residual area of the first silicon nitride film 32 can be reduced compared with that obtained in the eighth embodiment. The smaller the area of the silicon nitride film, the smaller the storage capacity of the wiring in the semiconductor device. Accordingly, the ninth embodiment enables manufacture of a semiconductor device which is lower in wiring resistance than that manufactured under the method according to the eight embodiment.

Tenth Embodiment

A tenth embodiment of the present invention will now be described by reference to FIGS. 12A to 12E. FIGS. 12A to 12E are cross-sectional views for describing the principal processes of a method of manufacturing a semiconductor device according to the tenth embodiment.

Figure 12A:
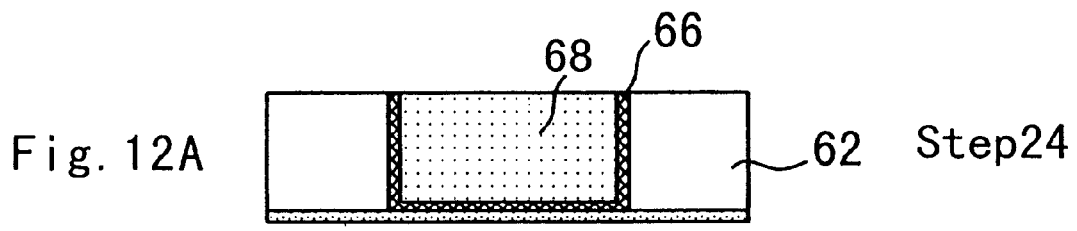
FIGS. 12A to 12E are cross-sectional views for describing principle processes of a method of manufacturing a semiconductor device according to a tenth embodiment of the present invention.

FIG. 12A shows a semiconductor device identical to that according to the sixth embodiment shown in FIG. 8E. As in the case of the sixth embodiment, the semiconductor device shown in FIG. 12A is manufactured by carrying out the processing of steps 20 to 24.

Figure 12B:
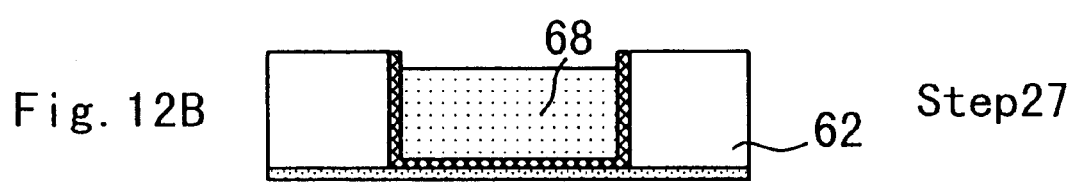

As shown in FIG. 12B, under the manufacturing method according to the tenth embodiment, the processing of step 27 is carried out as in the seventh embodiment (FIGS. 9A to 9E), whereby the surface of the primary metal material film 68 is reduced, through overetching or overpolishing, so as to become lower than the surface of the silicon oxide film 62 by 100 to 1000 angstroms or thereabouts.

Figure 12C:
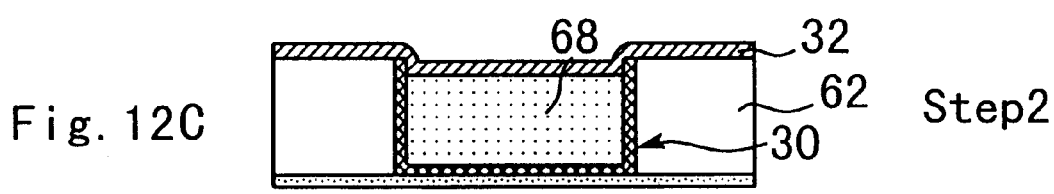

The first silicon nitride film 32 is formed on the silicon oxide film 62 and the primary metal material film 68, both of which are smoothed by overetching or overpolishing (step 2). Likewise the case of the eighth or ninth embodiment (see FIGS. 10A to 10C or FIGS. 11A to 11D), the first silicon nitride film 32 in the tenth embodiment corresponds to a silicon-rich film having an absorption factor of 0.5 to 1.0, i.e., a SiN film containing silicon and nitrogen in proportions of 1:1 (FIG. 12C).

Figure 12D:
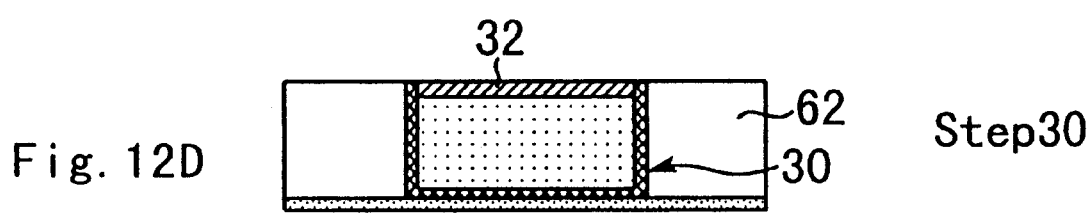
Figure 12E:
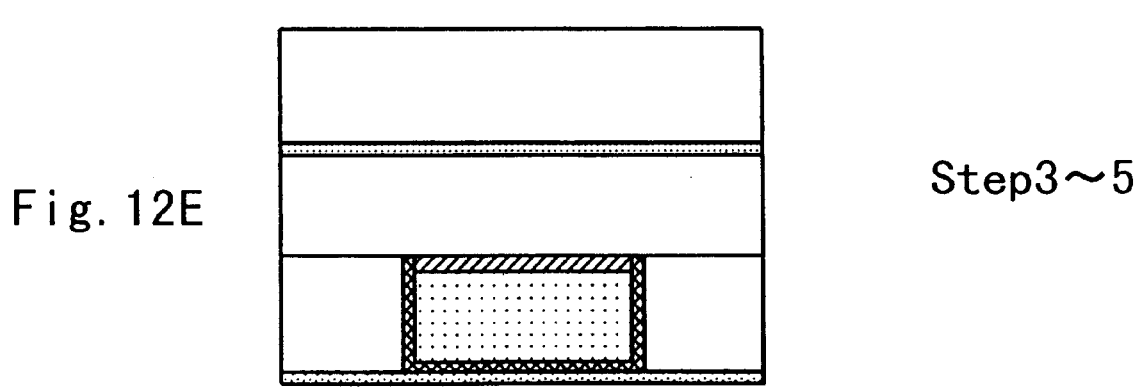

As shown in FIG. 12D, the first silicon nitride film 32 is smoothed by total etch back or chemical-and-mechanical polishing (CMP) until the surface of the first silicon nitride film 32 and the surface of the silicon oxide film 62 become smooth (step 30). Through the foregoing processing, the lower wiring layer 30 is formed in the silicon oxide film 62.

After formation of the lower wiring layer 30, processing steps identical to those performed in the sixth through ninth embodiments are performed, whereby a semiconductor device having a desired construction may be implemented. Under the tenth embodiment, the first silicon nitride film 32 acts as an ARC, barrier metal, and an etch stopper film as in the case of the eight and ninth embodiment. Thus, the manufacturing method according to the tenth embodiment enables manufacture of a semiconductor device having superior dimensional accuracy, through simple processing steps.

The manufacturing method according to the tenth embodiment enables a reduction in a residual area of the first silicon nitride film 32, as well as smoothing of the surface of the first silicon nitride film 32 and the surface of the silicon oxide film 62. Accordingly, the manufacturing method according to the tenth embodiment enables manufacture of a semiconductor device which is lower in wiring resistance than that manufactured under the method according to the eight embodiment, as well as enables facilitated formation of a highly-accurate wiring element on the lower wiring layer 30.

The major benefits of the present invention described above are summarized as follows:

According to a first aspect of the present invention, etching for forming a wiring trench is carried out after formation of an organic layer within a via hole. In this case, the organic layer acts as a protective film, and hence a lower wiring layer is protected from damage, which would otherwise be caused by the etching.

According to a second aspect of the present invention, the organic layer is formed up to an upper portion of an etch stopper film. In this case, during the process of the etching for the purpose of forming a wiring trench, a through-hole (a hole constituted of the via hole) formed in the etch stopper layer is protected by the organic layer. Consequently, the present invention enables prevention of damage to the lower wiring layer, which would otherwise result from an enlargement in the diameter of the upper edge of the via hole.

According to a third aspect of the present invention, the organic layer may be manufactured through simple processes using a photoresist.

According to a fourth aspect of the present invention, the organic layer may be formed through simple processes using an organic antireflective agent. When an organic antireflective film is formed on a second dielectric film, the present invention enables simultaneous formation of an organic layer and an organic antireflective film through a single process.

According to a fifth aspect of the present invention, primary metal material of a lower wiring layer can be coated with a high-melting-point metal film which prevents reflected light from causing halation. Thus, the present invention enables patterning of a photoresist with superior dimensional accuracy without being affected by halation during photolithography.

According to a sixth aspect of the present invention, a high-melting-point metal film can be formed through simple processes so as to cover solely the upper surface of primary metal material of the lower wiring layer.

According to a seventh aspect of the present invention, a high-melting-point metal film can be formed, through simple processes, within a lower wiring trench so as to cover solely the upper surface of primary metal material of the lower wiring layer. In this case, the high-melting-point metal film does not extend beyond the edges of the lower wiring trench, so that a short margin provided between wiring elements may be reduced. Further, the surface of the high-melting-point metal film and the surface of a silicon substrate are smoothed, thereby enabling facilitated and accurate formation of wiring elements on the lower wiring layer.

According to an eighth aspect of the present invention, the primary metal material of the lower wiring layer may be coated with a silicon nitride film having an absorption factor of 0.5 to 1.0. The silicon nitride film may prevent reflected light from causing halation. Accordingly, the present invention enables patterning of a photoresist with superior dimensional accuracy at the time of photolithography without being affected by halation.

According to a ninth aspect of the present invention, the present invention enables formation, through simple processes, of a silicon nitride film having an absorption factor of 0.5 to 1.0 so as to cover only the upper surface of the primary metal material of the lower wiring layer. Accordingly, the present invention enables a reduction in the storage capacity of the semiconductor device while accomplishing prevention of halation.

According to a tenth aspect of the present invention, the present invention enables formation, through simple processes, of a silicon nitride film having an absorption factor of 0.5 to 1.0 within the lower wiring trench so as to cover solely the upper surface of primary metal material of the lower wiring layer. In this case, the surface of the silicon nitride film and the surface of the silicon substrate become smooth, and hence wiring elements may be readily formed on the lower wiring layer with superior accuracy.

According to an eleventh aspect of the present invention, an etch stopper film which acts as an stopper film during etching of a wiring trench is formed from a silicon nitride film having an absorption factor of 0.5 to 1.0. In this case, the amount of light that passes through the photoresist is reduced by the etch stopper film, thus the influence of halation may be mitigated to a much greater extent.

According to a twelfth aspect of the present invention, an antireflective high-melting-point metal film is formed on the surface of the second dielectric film. In this case, since light is efficiently reflected by the surface of the antireflective high-melting-point metal film, a difference between the optical paths of direct light and the reflected light is efficiently prevented. Accordingly, the present invention enables a photoresist to be patterned with considerably superior accuracy.

According to a thirteenth aspect of the present invention, an antireflective silicon nitride film having an absorption factor of 0.5 to 1.0 is formed on the surface of the second insulating film. In this case, since light is efficiently reflected by the surface of the antireflective silicon nitride film, a difference between the optical paths of direct light and reflected light is efficiently prevented. For this reason, the present invention enables a photoresist to be patterned with considerably superior accuracy.

According to a fourteenth aspect of the present invention, an exposure process of a photoresist is always performed while an organic antireflective film is formed between the second dielectric film and the photoresist. In this case, the light that irradiates the photoresist is efficiently reflected by the surface of the organic antireflective film, thus preventing a difference between the optical paths of the reflected light rays. The present invention, therefore, enables a photoresist to be patterned with considerably superior accuracy.

Further, the present invention is not limited to these embodiments, but variations and modifications may be made without departing from the scope of the present invention.

The entire disclosure of Japanese Patent Application No. Hei 10-318556 filed on Nov. 10, 1998 including specification, claims, drawings and summary are incorporated herein by reference in its entirety.

What is claimed is:

1. A method of manufacturing a semiconductor device having a wiring element of dual damascene structure, the method comprising the sequential steps of:
   forming on a lower wiring layer a film for preventing diffusion of metal;
   forming a first dielectric film on the metal diffusion prevention film;
   forming an etch stopper film on the first dielectric film;
   forming a second dielectric film on the etch stopper film;
   forming a via hole at a position above the lower wiring layer by etching through the second dielectric film, the etch stopper film, and the first dielectric film;
   forming an organic layer within the via hole so as to cover the internal wall surface of the via hole; and
   forming a wiring trench after formation of the organic layer by etching a predetermined portion of the second dielectric film;
   wherein the organic layer is formed so as to cover at least an area of the via hole from the bottom of the via hole to the internal surface of the second dielectric film.

2. The method of manufacturing a semiconductor device according to claim 1, wherein the step of forming an organic layer comprises the steps of:
   filling the via hole with photoresist; and
   setting the photoresist.

3. The method of manufacturing a semiconductor device according to claim 1, wherein the step of forming an organic layer comprises a step of forming, inside the via hole, a layer of organic antireflective agent as the organic layer.

4. The method of manufacturing a semiconductor device according to claim 1, wherein the step of forming a lower wiring layer comprises the steps of:
   forming an etch stopper film on a silicon substrate;
   forming a base dielectric film on the etch stopper film;
   forming a lower wiring trench through photolithography and anisotropic etching;
   filling the lower wiring trench with primary metal material after a high-melting-point metal film has been formed in the lower wiring trench;
   removing an excessive primary metal material that exists outside of the lower wiring trench; and
   forming a high-melting-point metal film on the primary metal material.

5. The method of manufacturing a semiconductor device according to claim 4, further comprising a step of filling the lower wiring trench with primary metal material and then smoothing the lower wiring trench until the surface of the base dielectric film becomes exposed and the primary metal material that exists outside the lower wiring trench disappears, and
   wherein the step of forming a high-melting-point metal film comprises the steps of:
      forming a high-melting-point metal layer at a position above the silicon substrate and the primary metal material; and
      etching away the high-melting-point metal layer such that the high-melting-point metal layer is left only in a predetermined location where it covers the primary metal film.

6. The method of manufacturing a semiconductor device according to claim 4, further comprising a step of recessing the surface of the primary metal material which has been filled in the lower wiring trench, so that the primary metal material becomes lower than the surface of the base dielectric film by a predetermined depth, and
   wherein the step of forming a high-melting-point metal film comprises the steps of:
      forming a high-melting-point metal layer at a position above the base dielectric film and the primary metal material after the surface of the primary metal material has been recessed; and
      removing the high-melting-point metal film until the surface of the base dielectric film becomes exposed such that the high-melting-point metal layer is left only at a predetermined location where it covers the primary metal film.

7. The method of manufacturing a semiconductor device according to claim 1, wherein the step of forming a lower wiring layer comprises the steps of:
   forming a lower wiring trench in the base dielectric film;
   filling the lower wiring trench with primary metal material after formation of a high-melting-point metal film in the lower wiring trench; and
   forming, on the primary metal material, a silicon nitride film having an absorption factor of 0.5 to 1.0.

8. The method of manufacturing a semiconductor device according to claim 7, further comprising a step of filling the lower wiring trench with primary metal material and then smoothing the surface of the base dielectric film and the surface of the primary metal material, and wherein the step of forming a silicon nitride film comprises the steps of:
forming a silicon nitride layer having an absorption factor of 0.5 to 1.0 on the silicon substrate and the primary metal; and
etching the silicon nitride layer such that the silicon nitride layer exists only at a predetermined location where it covers the primary metal film.

9. The method of manufacturing a semiconductor device according to claim 7, further comprising a step of recessing the surface of the primary metal material which has been filled in the lower wiring trench, so that the surface of the primary metal material becomes lower than the surface of the base dielectric film by a predetermined depth, and wherein the step of forming a silicon nitride film comprises the steps of:
forming a silicon nitride layer at a position above the silicon substrate and the primary metal material after the surface of the primary metal material has been recessed; and
removing the silicon nitride layer until the surface of the base dielectric film becomes exposed such that the silicon nitride layer is left only at a position where it covers the primary metal film.

10. The method of manufacturing a semiconductor device according to claim 1, wherein the etch stopper film includes a silicon nitride film having an absorption factor of 0.5 to 1.0.

11. The method of manufacturing a semiconductor device according to claim 1, wherein the step of forming a via hole comprises the steps of:

growing a first organic antireflective film at a position above the second dielectric film; and
forming, at a position above the first organic antireflective film, a first photoresist film so that the first photoresist film has an opening at a position corresponding to the via hole, and wherein the step of forming a wiring trench comprises the steps of:
growing a second organic antireflective film on the second dielectric film, and
forming, at a position above the second organic antireflective film, a second photoresist film that has an opening corresponding to the wiring trench.

12. The method according to claim 1, comprising forming the via hole by:
first etching through the second dielectric film stopping on and exposing the etch stopper film;
then etching through the etch stopper film stopping on and exposing the first dielectric film; and
then etching through the first dielectric film.

13. A method of manufacturing a semiconductor device having a wiring element of dual damascene structure, the method comprising the sequential steps of:

forming on a lower wiring layer a film for preventing diffusion of metal;

forming a first dielectric film on the metal diffusion prevention film;

forming an etch stopper film on the first dielectric film;

forming a second dielectric film on the etch stopper film;

forming a via hole at a position above the lower wiring layer by etching through the second dielectric film, the etch stopper film, and the first dielectric film;

forming an organic layer within the via hole so as to cover the internal wall surface of the via hole;

forming a wiring trench after formation of the organic layer by etching away a predetermined portion of the second dielectric film;

forming an antireflective high-melting-point metal film at a position above the second dielectric film before opening of the via hole; and removing the antireflective high-melting-point metal film that exists at the position above the second dielectric film after formation of the wiring trench, wherein the step of forming a via hole comprises a step of removal of the portion of the antireflective high-melting-point metal film that corresponds to the via hole, and wherein the step of forming a wiring trench comprises a step of removal of the portion of the antireflective high-melting-point metal film that corresponds to the wiring trench.

14. A method of manufacturing a semiconductor device having a wiring element of dual damascene structure, the method comprising the sequential steps of:

forming on a lower wiring layer a film for preventing diffusion of metal;

forming a first dielectric film on the metal diffusion prevention film;

forming an etch stopper film on the first dielectric film;

forming a second dielectric film on the etch stopper film;

forming a via hole at a position above the lower wiring layer by etching through the second dielectric film, the etch stopper film, and the first dielectric film;

forming an organic layer within the via hole so as to cover the internal wall surface of the via hole;

forming a wiring trench after formation of the organic layer by etching away a predetermined portion of the second dielectric film;

forming an antireflective silicon nitride film having an absorption factor of 0.5 to 1.0 at a position above the second dielectric film before opening of the via hole; and removing the antireflective silicon nitride film that exists at the position above the second dielectric film after formation of the wiring trench, wherein the step of forming a via hole comprises a step of removal of the portion of the antireflective silicon nitride film that corresponds to the via hole, and wherein the step of forming a wiring trench comprises a steps of removal of the portion of the antireflective silicon nitride film that corresponds to the wiring trench.

* * * * *